United States Patent
Tanabe et al.

[11] Patent Number: 5,968,848
[45] Date of Patent: Oct. 19, 1999

[54] PROCESS FOR TREATING A LITHOGRAPHIC SUBSTRATE AND A RINSE SOLUTION FOR THE TREATMENT

[75] Inventors: Masahito Tanabe; Kazumasa Wakiya; Masakazu Kobayashi; Toshimasa Nakayama, all of Kanagawa, Japan

[73] Assignee: Tokyo Ohka Kogyo Co., Ltd., Kanagawa, Japan

[21] Appl. No.: 08/998,378

[22] Filed: Dec. 24, 1997

[30] Foreign Application Priority Data

Dec. 27, 1996 [JP] Japan .................................. 8-356731

[51] Int. Cl.$^6$ ............................ H01L 21/306; B08B 3/08
[52] U.S. Cl. .............................. 438/745; 438/906; 134/2; 134/3; 134/41; 510/176
[58] Field of Search .............................. 134/1.3, 2, 3, 41; 430/329; 510/176; 438/745, 906

[56] References Cited

U.S. PATENT DOCUMENTS

| | | | |
|---|---|---|---|
| 5,102,777 | 4/1992 | Lin et al. ................. | 510/176 |
| 5,320,709 | 6/1994 | Bowden et al. ........... | 438/745 |
| 5,376,236 | 12/1994 | Hanson et al. ............ | 216/108 |
| 5,417,877 | 5/1995 | Ward ....................... | 510/176 |
| 5,478,436 | 12/1995 | Winebarger et al. ..... | 438/693 |
| 5,567,574 | 10/1996 | Hasemi et al. ............ | 438/704 |
| 5,571,447 | 11/1996 | Ward et al. ............... | 510/206 |
| 5,630,904 | 5/1997 | Aoyama et al. .......... | 438/669 |
| 5,698,503 | 12/1997 | Ward et al. ............... | 510/176 |
| 5,709,756 | 1/1998 | Ward et al. ............... | 134/1.3 |
| 5,792,274 | 8/1998 | Tanabe et al. ............ | 134/1.3 |

FOREIGN PATENT DOCUMENTS

| | | |
|---|---|---|
| 0662705 | 7/1995 | European Pat. Off. . |
| 0680078 | 11/1995 | European Pat. Off. . |
| 0773480 | 5/1997 | European Pat. Off. . |
| 8-202052 | 8/1996 | Japan . |

*Primary Examiner*—Benjamin Utech
*Assistant Examiner*—Donald L. Champagne
*Attorney, Agent, or Firm*—Sughrue, Mion, Zinn, Macpeak & Seas, PLLC

[57] ABSTRACT

This invention relates to a process for rinsing a substrate which has been provided with a desired resist pattern and subjected to an etching treatment, and optionally, subsequent ashing treatment, said process including the steps of: (I) treating said resist pattern with a remover solution which contains, as a principal ingredient, a salt of hydrofluoric acid and a metallic-ion-free base; (II) rinsing said substrate with a rinse solution for lithography which contains ethylene glycol and/or propylene glycol, and a water-soluble organic solvent other than said glycol; and (III) washing said substrate with water.

12 Claims, No Drawings

PROCESS FOR TREATING A LITHOGRAPHIC SUBSTRATE AND A RINSE SOLUTION FOR THE TREATMENT

BACKGROUND OF THE INVENTION

The present invention relates to a process for treating a lithographic substrate, and more particularly, to a process for treating a lithographic substrate for a semiconductor device such as IC or LSI, a liquid-crystal panel device, or the like wherein a resist film is removed and then rinsed.

Further, it relates to the treatment of a substrate using such a rinse solution for lithography.

Conventionally, the process for manufacturing a semiconductor device such as an IC or LSI, or a liquid-crystal panel device includes the following steps of:

forming a conductive metallic film of aluminum, copper, aluminum alloy or the like, an insulating film of $SiO_2$ or the like, etc. on a substrate;

uniformly applying a photoresist onto such films;

exposing the photoresist, or scanning the photoresist with electron rays, and then developing the resultant to form a resist pattern;

selectively etching the above-described conductive metallic film, insulating film, etc. using the obtained pattern as a mask, thus forming a fine circuit or the like; and then, removing the waste resist film with a remover solution.

In case where no ashing process is applied as described above, the waste resist film can be removed with a remover solution. Alternatively, in case where a dry etching and subsequently an ashing process are carried out, a degenerated resist film (by-product of dry etching adhered to the resist) is removed with a remover solution.

Examples of solutions for removing such a resist film include:

organic sulfonic-acid-based remover solutions in each of which the principal ingredient is an alkylbenzenesulfonic acid;

organic amine-based remover solutions wherein the principal ingredient is an organic amine such as monoethanolamine; and hydrofluoric-acid-based remover solutions wherein the principal ingredient is hydrofluoric acid.

Organic sulfonic-acid-based remover solutions are difficult to handle and cause environmental problems since they are generally used in combination with another highly toxic organic solvent such as a phenolic compound, chlorobenzene, or the like. In addition, they readily corrode conductive metallic films and the like on the substrate.

Meanwhile, organic amine-based remover solutions are less toxic than organic sulfonic-acid-based remover solutions, and do not require a complicated procedure for waste disposal. And they exhibit excellent anticorrosion effects. Such remover solutions are, however, not sufficient at removing resist film which was treated by a process such as dry etching, ashing, or ion-implantation, and has degenerated to the extent that it exhibits inorganic properties. Moreover, since the removal treatment temperature when using such a remover solution is as high as 60 to 130° C., combustible organic compounds in the remover solution may become volatile and because the danger of ignition, a great investment is necessary for facilities to prevent various disasters.

As for hydrofluoric-acid-based remover solutions whose principal ingredient is hydrofluoric acid, although they are superior at removing film degenerated to the extent that it exhibits inorganic properties, handling them is difficult since they are hazardous for humans and therefore difficult to handle. Further, since the compositions containing such a remover solution become acidic, peripheral apparatuses such as a chemical-solution-feeding apparatus communicated with a bath for removal treatment and a container for storage of the remover solution are readily corroded by the remover solution. In addition, complicated exhaust-gas treatment and waste-solution disposal are required.

As a remover solution for solving the above-described problems, the present inventors previously offered a remover solution in which the principal ingredient is a salt of a hydrofluoric acid and a metallic-ion-free base (hereinafter referred to as hydrofluorate remover solution) as described in a copending U.S. patent application Ser. No. 08/747,898. By using the hydrofluorate remover solution, the removal treatment can be performed at a low temperature and in a short period of time, thin metallic films on the substrate and peripheral apparatuses can be prevented from being corroded, and the exhaust-gas treatment and waste-solution disposal can be simplified. The hydrofluorate remover solution, however, corrodes thin metallic films such as those of Ti, Al, Al—Si, and Al—Si—Cu when the time for washing treatment with pure water after the removal treatment exceeds approximately 10 minutes. Further, if the washing treatment is performed using an organic solvent such as methanol, ethanol, isopropyl alcohol, or acetone, which have been conventionally used as a rinsing solution, instead of pure water, salts of hydrofluoric acid may be deposited on the substrate. Moreover, if the washing treatment is performed using ethylene glycol instead of pure water, the fine portions cannot be sufficiently washed because of its high viscosity, and it is difficult to completely wash off the remover solution.

SUMMARY OF THE INVENTION

In order to solve the above-described disadvantages or inconveniences, the inventors earnestly conducted research, and discovered the following facts:

a solution containing ethylene glycol and/or propylene glycol and another water-soluble organic solvent can be used as a solution for rinsing substrate that has been subjected to a removal treatment using a hydrofluorate remover solution;

by using such a solution, thin metallic films can be prevented from corroding, and fine portions of the substrate can be sufficiently washed; and cost reduction for disposal of the waste solution derived from the pure water used for washing after the rinse treatment can be realized.

Thus the object of the present invention is to provide a process for treating a substrate which achieves sufficient washing of the fine portions on a substrate without corroding metallic films on the substrate.

Another object of the present invention is to provide a rinse solution for lithography.

Thus the present invention provides a process for treating a substrate which has been provided with a desired resist pattern and subjected to an etching treatment, and optionally, subsequent ashing treatment, said process including the steps of:

(I) treating said resist pattern or degenerated resist pattern with a remover solution which contains, as a principal ingredient, a salt of hydrofluoric acid and a metallic-ion-free base;

(II) rinsing said substrate with a rinse solution for lithography which contains ethylene glycol and/or propylene glycol and a water-soluble organic solvent other than said glycols; and (III) washing said substrate with water.

The present invention further provides said process for treating a substrate wherein said rinse solution contains 5 to 60% by weight of ethylene glycol and/or propylene glycol and 40 to 95% by weight of said water-soluble organic solvent.

DESCRIPTION OP THE PREFERRED EMBODIMENT

The process of the present invention for treating a substrate which has been provided with a desired resist pattern and subjected to an etching treatment, and optionally, subsequent ashing treatment includes the steps of:

(I) treating the resist pattern with a remover solution which contains, as a principal ingredient, a salt of hydrofluoric acid and a metallic-ion-free base;

(II) rinsing the substrate with a rinse solution for lithography which contains ethylene glycol and/or propylene glycol and a water-soluble organic solvent other than ethylene glycol; and (III) washing the substrate with water.

The step to provide the resist pattern on the substrate may be performed in accordance with a commonly performed pattern-forming method such as the one described below:

a positive or negative resist composition is applied to a substrate for a semiconductor device or a liquid-crystal panel device, such as a silicon wafer or a glass substrate, by, for example, a method such as a rotating application method, a roll coater method, or a bar coater method, thus forming a resist film;

drying the resist film;

a latent image is formed by exposing or scanning the dried resist film with radiation such as far ultraviolet rays including excimer laser beams, electron rays, or X-rays through a mask pattern; and developing the latent image with an alkaline aqueous solution to form a resist pattern.

The substrate thus masked with resist pattern is dry-etched. In case where no ashing process is applied, a waste resist film is removed with a remover solution. Alternatively, in case where an ashing process follows dry etching, a degenerated resist film to which by-product of dry etching adhered is removed with a remover solution.

The process of the present invention is particularly suitable for the latter case, i.e., removing treatment after, the ashing process. The etching and ashing processes may be ones conventionally used.

The step of treating the resist pattern with the remover solution may be performed by a dipping method or the like at room temperature for 1 to 20 minutes. Meanwhile, the rinsing step may be performed by a dipping method or the like, at room temperature for 3 to 20 minutes.

In a conventional removal process, the step of washing with water is carried out without a prior rinsing step, which is step (II) in the present invention, and washing is repeated using a large volume of water. Consequently, fluoride ions and fluorides are accumulated in the washing bath, and a complicated procedure is required for the disposal of the waste solution. In contrast, in the process of treating a substrate of the present invention, the rinsing step is carried out before the washing step, and therefore, fluoride ions and fluorides are not accumulated in the washing bath. Accordingly, the cost for disposal of the waste solution in the washing bath can be reduced, and further, the removal step, the rinsing step, and the washing step can be continuously and efficiently carried out.

The above-described hydrofluorate remover solution contains a salt of a hydrofluoric acid and a metallic-ion-free base [ingredient (a)] as a principal ingredient, and is not especially limited so long as it contains such an ingredient (a) as a principal ingredient. Preferably, the remover solution should be a resist-removing solution which contains an ingredient (a), a water-soluble organic solvent [ingredient (b)], and water [ingredient (c)], and be almost neutral with a pH value of 5 to 8.

Here, the metallic-ion-free base means a base which does not form a metallic-ion-containing solution when the base is dissolved in water, such as an organic amine, examples of which include hydroxyl amines, primary, secondary or tertiary aliphatic amines, alicyclic amines, aromatic amines, and heterocyclic amines; an aqueous ammonia; or a lower-alkyl quaternary ammonium base. As is well known, metallic ions affect the properties of the product devices during the manufacture of semiconductor devices or liquid-crystal devices. From this point of view, metallic ions in the remover solution should be reduced, and therefore, such a metallic-ion-free base is preferably used.

Typical examples of hydroxylamines include hydroxylamine and N,N-diethylhydroxylamine. Typical examples of primary aliphatic amines include monoethanolamine, ethylenediamine, and 2-(2-aminoethylamino)ethanol. Typical examples of secondary amines include diethanolamine, dipropylamine, and 2-ethylaminoethanol. Typical examples of tertiary amines include dimethylaminoethanol, and ethyldiethanolamine. Typical examples of alicyclic amines include cyclohexylamine, and dicyclohexylamine. Typical examples of aromatic amines include benzylamine, dibenzylamine, and N-methylbenzylamine. Typical examples of heterocyclic amines include pyrrole, pyrrolidine, pyrrolidone, pyridine, morpholine, pyrazine, piperidine, N-hydroxyethylpiperidine, oxazole, and thiazole. Further, typical examples of lower-alkyl quaternary ammonium bases include tetramethylammonium hydroxide, trimethyl(2-hydroxyethyl)ammonium hydroxide(choline). Among these, aqueous ammonia, monoethanolamine, and tetramethylammonium hydroxide are preferred since they can be easily obtained and are safer.

A salt of such a metallic-ion-free base and a hydrofluoric acid can be prepared by adding the metallic-ion-free base to a commercially available hydrofluoric acid solution having a hydrogen fluoride concentration of 50 to 60% such that the pH of the mixture becomes 5 to 8. Needless to say, a commercially available ammonium fluoride can be used as such a salt.

In order to prepare the hydrofluorate remover solution so that it is almost neutral with a pH of 5 to 8, ingredient (a) should be prepared so that it is almost neutral. Although a uniform specification cannot be uniformly made, since the amount of the metallic-ion-free base added to the hydrofluoric acid solution for neutralization varies depending on the type of base, for example, in the case of an aqueous ammonia, an ingredient (a) having a desirable pH value can be prepared by mixing a hydrofluoric acid solution and aqueous ammonia having equal volumes and equal molar concentrations. Meanwhile, in the case of monoethanolamine, an ingredient (a) can be obtained by mixing 1,000 ml of a hydrofluoric acid solution having a concentration of 1 mole/liter with 1 mole of monoethanolamine. By adjusting the pH of ingredient (a) to a value within the above-described range, the ability of the remover solution to remove degenerated films is not lessened, metallic films on the substrate and peripheral apparatuses such as a chemical solution-feeding apparatus can be prevented from corroding, and the remover solution can be handled safely. Further, since the hydrogen fluoride content is reduced, a complicated exhaust-gas treatment and waste-solution disposal to prevent hydrogen fluoride from being generated are unnecessary.

As the ingredient (b) in the the above-described hydrofluorate remover solution, solvents that are substantially similar to those for the water-soluble organic solvent used in the rinse solution for lithography can also be used. Ethylene glycol can also be used as a water-soluble organic solvent of the ingredient (b). Among such water-soluble organic solvents, dimethylsulfoxide, N,N-dimethylformamide, N,N-dimethylacetamide, N-methyl-2-pyrrolidone, 1,3-dimethyl-2-imidazolidinone, ethylene glycol, and diethylene glycol monobutyl ether are preferred since they have a superior ability to remove degenerated resist films. Dimethylsulfoxide, ethylene glycol, or a mixture thereof are especially preferred. In such a mixture, the weight ratio of ethylene glycol to dimethylsulfoxide should preferably be 1:9 to 6:4.

Regarding the percentage of each ingredient in the above-described hydrofluorate remover solution, the content of ingredient (a) is 0.2 to 10% by weight, preferably, 0.5 to 5% by weight, the content of ingredient (b) is 30 to 90% by weight, preferably, 40 to 70% by weight, and the content of ingredient (c) is 5 to 50% by weight, preferably, 20 to 40% by weight. By adjusting the content of each ingredient within the above-described range, the ability to remove degenerated films, the removal properties at room temperature, and the effect of preventing the substrate from being corroded can be improved. In particular, it is essential that the above-described ranges be maintained when the substrate subjected to removal treatment is a readily corrodible substrate formed by vapor-depositing a metal, such as an Al substrate, an Al—Si substrate, or an Al—Si—Cu substrate. With a content of the ingredient (a) lower than the above-described range, the ability to remove degenerated films will be lowered. On the other hand, with a content higher than the range, the substrate will be readily corroded.

Additionally, the above-described hydrofluorate remover solution may contain an anticorrosive. The same anticorrosives as those which can be used in the rinse solution for lithography mentioned below can also be used as ingredient (d). By adding such an ingredient (d), the anticorrosion properties of the remover solution can be further improved without affecting its ability to remove degenerated films on a substrate formed of Al, Al—Si, or Al—Si—Cu or the like.

Regarding the percentage of each ingredient in the above-described hydrofluorate remover solution containing ingredient (d), the content of the ingredient (a) is 0.2 to 10% by weights preferably, 0.5 to 5% by weight, the content of ingredient (b) is 30 to 80% by weight, preferably, 40 to 70% by weight, the content of ingredient (c) is 5 to 50% by weight, preferably, 20 to 40% by weight, and the content of ingredient (d) is 0.5 to 15% by weight, preferably, 0.5 to 10% by weight. If the content of any one of the ingredients deviates from the above-described range, the remover solution will have an inferior ability to remove degenerated films, and inferior anticorrosion properties.

The rinse solution used in the step (II) of the process of the present invention is used to rinse a substrate for a semiconductor device or liquid-crystal panel device which has been subjected to a removal treatment using a hydrofluorate remover solution, and is a composition containing ethylene glycol and/or propylene glycol and another water-soluble organic solvent.

The water-soluble organic solvent is a water-soluble organic solvent other than ethylene glycol and propylene glycol, and examples of such solvents include:

monohydric alcohols such as methyl alcohol, ethyl alcohol, and isopropyl alcohol;

ketones such as acetone;

sulfoxides such as dimethyl sulfoxide;

sulfones such as dimethyl sulfone, diethyl sulfone, bis(2-hydroxyethyl) sulfone, and tetramethylene sulfone;

amides such as N,N-dimethylformamide, N-methylformamide, N,N-dimethylacetamide, N-methylacetamide, and N,N-diethylacetamide;

lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone;

imidazolidinones such as 1,3-dimethyl-2-imidazolidinone, 1,3-diethyl-2-imidazolidinone, and 1,3-diisopropyl-2-imidazolidinone;

lactones such as γ-butyrolactone, and δ-valerolactone; and polyhydric alcohols and derivatives thereof such as ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, and diethylene glycol monobutyl ether.

Among these, methyl alcohol, ethyl alcohol, isopropyl alcohol, acetone, dimethylsulfoxide, N,N-dimethylformamide, N,N-dimethylacetamide, N-methyl-2-pyrrolidone, 1,3-dimethyl-2-imidazolidinone, and diethylene glycol monobutyl ether are preferred. Monohydric alcohols such as methyl alcohol, ethyl alcohol, and isopropyl alcohol are particularly preferred. Further, among these, isopropyl alcohol is preferred since it is inexpensive and does not require complicated treatment for disposal of the waste rinse solution.

The rinse solution for lithography according to the present invention contains 5 to 60% by weight, preferably, 20 to 50% by weight of ethylene glycol and/or propylene glycol, and 40 to 95% by weight, preferably, 50 to 80% by weight of another water-soluble organic solvent. With less than 40% by weight of a water-soluble organic solvent other than ethylene glycol, the rinse solution will be inferior in washing fine portions, and with more than 95% by weight of such a water-soluble organic solvent, salts of hydrofluoric acid may be undesirably deposited on the substrate.

The rinse solution for lithography according to the present invention may contain an anticorrosive in addition to the above-described ingredients. The anticorrosive may be, for example, an aromatic hydroxy compound, an acetylene alcohol, a carboxyl-group-containing organic compound or an anhydride thereof, a triazole compound, or a saccharide.

Typical examples of such aromatic hydroxy compounds include phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenetyl alcohol, p-aminophenol, m-aminophenol, diaminophenol, aminoresorcinol, p-hydroxybenzoic acid, o-hydroxybenzoic acid, 2,4- dihydroxybenzoic acid, 2,5-dihydroxybenzoic acid, 3,4-dihydroxybenzoic acid, and 3,5-dihydroxybenzoic acid. Among these, pyrocatechol is preferred.

Typical examples of acetylene alcohols include 2-butyne-1,4-diol, 3,5-dimethyl-1-hexyne-3-ol, 2-methyl-3-butyne-2-ol, 3-methyl-1-pentyne-3-ol, 3,6-dimethyl-4-octyne-3,6-diol, 2,4,7,9-tetramethyl-5-decyne-4,7-diol, and 2,5-dimethyl-3-hexyne-2,5-diol. Among these, 2-butyne-1,4-diol is preferred.

Examples of carboxyl-group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid, citric acid, acetic anhydride, phthalic anhydride, maleic anhydride, succinic anhydride, and salicylic acid. Formic acid, phthalic acid, benzoic acid, phthalic anhydride, and salicylic acid are the preferred carboxyl-group-containing organic compounds. Phthalic anhydride and salicylic acid are especially preferred.

Examples of triazole compounds include benzotriazole, o-tolyltriazole, m-tolyltriazole, p-tolyltriazole, carboxybenzotriazole, 1-hydroxytriazole, nitrobenzotriazole, and dihydroxypropylbenzotriazole. Among these, benzotriazole is preferred.

Typical examples of saccharides include D-sorbitol, arabitol, mannitol, sucrose, and starch. Among these, D-sorbitol is preferred.

Each of the above-listed anticorrosives may be used alone, or in combination with one or more of the other anticorrosives.

According to the present invention, the rinse solution for lithography containing the above-described anticorrosive preferably contains:

5 to 40% by weight, and more preferably 10 to 30% by weight of ethylene glycol and/or propylene glycol;

55 to 90% by weight, and more preferably 60 to 85% by weight of another water-soluble organic solvent: and 0.5 to 15% by weight, and more preferably 1 to 5% by weight of an anticorrosive. Content of an anticorrosive within such a range is preferred since thin metallic films can be kept prevented from corroding further.

The present invention will be further illustrated in detail with reference to the following examples, which are not intended to limit the scope of the invention.

EXAMPLES 1 TO 13

Silicon wafers each having a vapor-deposited Al—Si—Cu film with a thickness of approximately 1.0 μm were spinner-coated with a positive photoresist, THMR-iP3300 (manufactured by Tokyo Ohka Kogyo Co., Ltd.), consisting principally of a naphtoquinonediazide compound and a novolak resin, and then pre-baked at 90° C. for 90 seconds. to form a resist film on each wafer with a thickness of 2.0 μm. Each resist film was exposed through a mask pattern using an aligner, NSR-2005i10D (manufactured by Nikon Corporation), and then developed with a 2.38% by weight tetramethylammonium hydroxide aqueous solution to form a resist pattern. Subsequently, post-baking was performed at 120° C. for 90 seconds.

Next, each silicon wafer having a vapor-deposited Al—Si—Cu film of approximately 1.0 μm thickness, on which the resist pattern was formed, was etched with an etchant gas mixture of chlorine and boron trichloride under a pressure of 5 Torr at a stage temperature of 20° C. for 168 sec. using an etching apparatus, TSS-6000 (manufactured by Tokyo Ohka Kogyo Co., Ltd.). Subsequently, each wafer was subjected to an after-corrosion treatment with an oxygen and trifluoromethane gas mixture under a pressure of 20 Torr at a stage temperature of 20° C. for 90 seconds. After this treatment, each wafer was further subjected to an ashing treatment with oxygen gas under a pressure of 0.3 Torr at a stage temperature of 60° C. for 150 sec. using an ashing system, TCA-2400 (manufactured by Tokyo Ohka Kogyo Co., Ltd.).

Removal treatment was then carried out by dipping the thus treated wafers in a remover solution containing 1.0% by weight of ammonium fluoride salt, 69.0% by weight of dimethylsulfoxide, and 30% by weight of water at 23° C. for 5 minutes. Subsequently, each of the resulting wafers was rinsed with a rinse solution having a composition shown in Table 1, washed with pure water, and observed to evaluate the degree of corrosion of the substrate. The results are shown in Table 1.

COMPARATIVE EXAMPLE 1

Evaluation of the degree of corrosion of a substrate was performed in the same manner as Example 1 except that the rinse solution contained only water. The results are shown in Table 1.

COMPARATIVE EXAMPLE 2

Evaluation of the degree of corrosion of a substrate was performed in the same manner as Example 1 except that the rinse solution contained only isopropyl alcohol. As a result, although corrosion could not be observed, ammonium fluoride salt was deposited during the rinse treatment.

TABLE 1

| | Composition of Rinse solution (weight ratio) | Degree of Corrosion after Dipping in Water at 23° C. for 20 min. |
|---|---|---|
| Example 1 | Methanol:Ethylene glycol (50:50) | Good |
| Example 2 | Methanol:Ethylene glycol (80:20) | Good |
| Example 3 | Ethanol:Ethylene glycol (70:30) | Good |
| Example 4 | Ethanol:Ethylene glycol: Pyrocatechol (30:68:2) | Good |
| Example 5 | Isopropyl Alcohol:Ethylene glycol (70:30) | Good |
| Example 6 | Isopropyl Alcohol:Ethylene glycol (50:50) | Good |
| Example 7 | Methanol:Propylene glycol (50:50) | Good |
| Example 8 | Methanol:Propylene glycol (80:20) | Good |
| Example 9 | Ethanol:Propylene glycol (70:30) | Good |
| Example 10 | Methanol:Propylene glycol: Pyrocatechol (30:66:2) | Good |
| Example 11 | Isopropyl Alcohol:Propylene glycol (70:30) | Good |
| Example 12 | Isopropyl Alcohol:Propylene glycol (50:50) | Good |
| Example 13 | Isopropyl Alcohol:Ethylene glycol: Propylene glycol (50:25:25) | Good |
| Comparative Example 1 | Water | Bad |
| Comparative Example 2 | Isopropyl Alcohol | Good |

Note) Degree of Corrosion
Good: No corrosion.
Bad: Corrosion was observed

It is obvious from the results described above, that the use of the rinse solution for lithographic substrate according to the present invention achieves satisfactory washing of fine portions on the substrate without causing corrosion of thin metal films such as Al, Al—Si, and Al—Si—Cu. Further, in the process of treating a substrate using the rinse solution for lithography according to the present invention, since the waste solution derived from pure water used for the rinsing step contains fluoride ions in only an extremely small amount, treatment of the waste solution is unnecessary, and therefore, the removal step, the rinsing step and the washing step can be continuously and efficiently carried out.

What is claimed is:

1. A process for treating a substrate which has been provided with a resist pattern and subjected to an etching treatment, and optionally, subsequent ashing treatment, said process including the steps of:

(I) treating said resist pattern with a remover solution which contains, as a principal ingredient, a salt of hydrofluoric acid and a metallic-ion-free base;

(II) rinsing said substrate with a rinse solution for lithography which contains 5 to 60% by weight of ethylene glycol and/or propylene glycol and 40 to 95% by weight of a water-soluble organic solvent other than said glycols; and (III) washing said substrate with water.

2. The process for treating a substrate according to claim 1, wherein said remover solution used in the step (I) is a resist-removing solution comprising:

an ingredient (a) comprising a salt of hydrofluoric acid and a metallic-ion-free base;

an ingredient (b) comprising at least one compound selected from the group consisting of dimethylsulfoxide, N,N-dimethylformamide, N,N-dimethylacetamide, N-methyl-2-pyrrolidone, 1,3-dimethyl-2-imidazolidinone, ethylene glycol, and diethylene glycol monobutyl ether; and an ingredient (c) water; and said solution having a pH within a range of 5 to 8.

3. The process for treating a substrate according to claim 2, wherein said remover solution used in the step (I) comprises 0.2 to 10% by weight of said ingredient (a), 30 to 90% by weight of said ingredient (b), and 5 to 50% by weight of said ingredient (c).

4. The process for treating a substrate according to claim 2 or 3, wherein said ingredient (a) is ammonium fluoride, and said ingredient (b) is dimethylsulfoxide.

5. The process for treating a substrate according to claim 1, wherein said water-soluble organic solvent comprises at least one solvent selected from the group consisting of alcohols, glycol monoethers, and aprotic polar solvents.

6. The process for treating a substrate according to claim 5, wherein said alcohols are methyl alcohol, ethyl alcohol, and isopropyl alcohol.

7. The process for treating a substrate according to claim 5, wherein said glycol monoethers include diethylene glycol monobutyl ether.

8. The process for treating a substrate according to claim 5, wherein said aprotic polar solvents are dimethyl sulfoxide, N,N-dimethylformamide, N,N-dimethylacetamide, N-methyl-2-pyrrolidone, and 1,3-dimethyl-2-imidazolidinone.

9. The process for treating a substrate according to claim 1, wherein said rinse solution further contains an anticorrosive.

10. The process for treating a substrate according to claim 9, wherein said anticorrosive comprises at least one compound selected from the group consisting of pyrocatechol, 2-butyne-1,4-diol, benzotriazole, and D-sorbitol.

11. The process for treating a substrate according to claim 9, wherein said rinse solution comprises 5 to 40% by weight of ethylene glycol and/or propylene glycol, 55 to 85% by weight of said water-soluble organic solvent, and 0.5 to 15% by weight of said anticorrosive.

12. The process for treating a substrate according to claim 1, wherein the rinsing solution contains ethylene glycol and a water-soluble organic solvent other than ethylene glycol.

* * * * *